United States Patent
Casper et al.

(10) Patent No.: US 8,213,148 B2
(45) Date of Patent: Jul. 3, 2012

(54) DOUBLE-SIDED PRINTED CIRCUIT BOARD COMPRISING A STRIP CONDUCTOR SAFETY FUSE

(75) Inventors: Günther Casper, Schlievsee (DE); Horst Werni, München (DE)

(73) Assignee: Osram AG, Munich (DE)

( * ) Notice: Subject to any disclaimer, the term of this patent is extended or adjusted under 35 U.S.C. 154(b) by 0 days.

(21) Appl. No.: 12/532,161

(22) PCT Filed: Apr. 4, 2007

(86) PCT No.: PCT/EP2007/053300
§ 371 (c)(1),
(2), (4) Date: Jan. 4, 2010

(87) PCT Pub. No.: WO2008/122309
PCT Pub. Date: Oct. 16, 2008

(65) Prior Publication Data
US 2010/0142110 A1    Jun. 10, 2010

(51) Int. Cl.
*H02H 5/04* (2006.01)
*H05K 1/16* (2006.01)
(52) U.S. Cl. ......... 361/104; 361/124; 361/720; 361/722
(58) Field of Classification Search ............... 361/104, 361/124, 720, 722
See application file for complete search history.

(56) References Cited

U.S. PATENT DOCUMENTS

| | | | |
|---|---|---|---|
| 5,010,438 A * | 4/1991 | Brady | 361/56 |
| 5,502,612 A * | 3/1996 | Osterhout et al. | 361/117 |
| 6,172,480 B1 * | 1/2001 | Vandelac | 320/125 |
| 6,501,634 B1 * | 12/2002 | Hubbell | 361/124 |
| 6,700,768 B2 | 3/2004 | Werni | |
| 7,385,475 B2 * | 6/2008 | Bender et al. | 337/297 |

FOREIGN PATENT DOCUMENTS

| | | |
|---|---|---|
| AU | 2005211526 A1 | 3/2006 |
| CA | 2190417 C | 6/2006 |
| DE | 3723832 C2 | 5/1989 |
| DE | 10125476 A1 | 7/2002 |
| DE | 20023606 U1 | 2/2005 |
| EP | 1308978 A2 | 5/2003 |
| EP | 0774887 B1 | 8/2004 |
| EP | 1638125 B1 | 10/2007 |
| WO | 0159799 A1 | 8/2001 |

OTHER PUBLICATIONS

Abstract corresponding to DE 3723832 C2.
Abstract corresponding to DE10125476.
International Search Report dated Jun. 18, 2007 of PCT/EP2007/053300.

* cited by examiner

*Primary Examiner* — Rexford Barnie
*Assistant Examiner* — Zeev V Kitov

(57) ABSTRACT

A double-sided printed circuit board may include: electrical conductor tracks fitted thereon and serving for electrically connecting components mounted on the printed circuit board, which has at least one conductor track fuse in the form of a conductor track with a fusible link part, wherein, upon the occurrence of an abnormal operating state, in particular an electrical short circuit, the electric circuit is interrupted by melting and evaporation of the fusible link part and plasma arises upon the evaporation of the fusible link part, wherein the fusible link part lies on the other side of the printed circuit board with respect to the supply line.

8 Claims, 2 Drawing Sheets

DOUBLE-SIDED PRINTED CIRCUIT BOARD COMPRISING A STRIP CONDUCTOR SAFETY FUSE

RELATED APPLICATIONS

Figure 1:
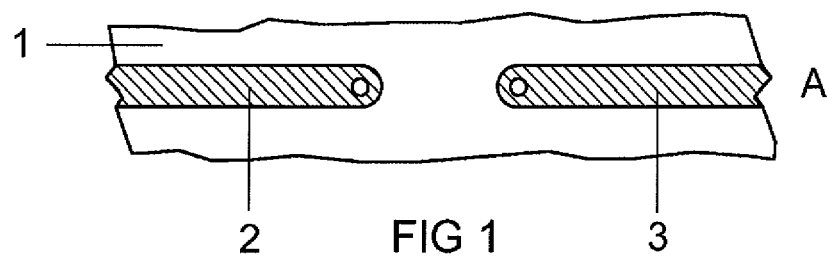

The present application is a national stage entry according to 35 U.S.C. §371 of PCT application No.: PCT/EP2007/053300 filed on Apr. 4, 2007.

BACKGROUND

The invention relates to a double-sided printed circuit board.

In the event of an abnormal operating state, in particular in the event of a short circuit, the conductor track fuse of a printed circuit board has the task of rapidly and reliably interrupting the connection to the voltage supply. This is intended to prevent the short circuit from propagating on the printed circuit board and incurring further damage. Moreover, the early response of the conductor track fuse is intended to prevent a power supply circuit-breaker from being triggered.

For this purpose, a specific conductor track section on the printed circuit board is often embodied as a fusible link. This conductor track section has a cross section which is constricted in comparison with the other conductor tracks on the printed circuit board and which is intended to melt in a controlled fashion and thus to interrupt the electric circuit when a short circuit occurs.

One problem in this case is that the plasma occurring during the melting and evaporation of the fusible link finds a new pair of contacts with low impedance under power supply voltage and thus continues to burn in an uncontrolled fashion. In this way, an indirect short circuit is triggered which in most cases burns between soldered joints and/or significantly wider conductor tracks and, on account of the greater amount of metal available, generates significantly more conductive plasma than the actual short circuit and thus causes further damage on the printed circuit board. The process escalates until finally the power supply circuit-breaker is triggered. The lower the impedance of the downstream power supply filter, that is to say the higher the rated power of the device, the more frequently the case described above occurs.

An attempt to solve this problem is found in EP 0 774 887 A2. The latter discloses a conductor track fuse in which two conductor track sections, through which current flows in opposite directions, are arranged as parallel as possible at a short distance from one another, such that the conductor track overall has a U shape. Owing to the short distance, the magnetic fields interact with one another in the region of the conduction sections. One of the conductor track sections has a constricted cross section and melts in the case of a short circuit. The resulting plasma is kept away from the adjacent conductor section owing to the interaction of the magnetic fields and the plasma can be prevented from continuing to burn.

However, the problem outlined in the introduction cannot be solved reliably and for every application by means of the abovementioned attempt. Primarily in the case of densely populated printed circuit boards, there is the risk of the plasma jumping over to other adjacent conductor tracks in which there is as yet no short-circuit current flowing and which accordingly also do not have a magnetic field (of whatever polarity) strong enough for repelling the plasma. Moreover, for reasons of space, it will not always be possible to accommodate this U-shaped conductor track fuse on every printed circuit board.

DE 37 23 832 A1 discloses a conductor track fuse in which a fusible link is likewise used, which has a conductor track cross section reduced by a cutout in this case. This location having the reduced cross section is covered with a spark-quenching medium. Moreover, the cutout in the fusible link, which can be e.g. a hole and can extend through to the printed circuit board, is intended to enable the gases that arise in the course of melting to flow away.

What is problematic about this solution is the complicated application of the covering layer and production of the cutout in the conductor track. Furthermore, a heat accumulation having an unfavorable effect on the interruption of the short-circuit current can arise underneath the covering layer.

SUMMARY

Various embodiments improve the operational reliability of the printed circuit board.

In the case of the printed circuit board according to various embodiments, the conductor track section embodied as a fusible link is on the other side of the printed circuit board with respect to the rest of the conductor track. This has the great advantage that, in the case of a short circuit, only the material of this section can evaporate since removal of material through the through contacts is highly improbable for various reasons. Firstly, the amount of material to be evaporated is relatively large in a through contact; secondly, this mass is present in a very compact fashion in the through contact and for this reason alone there is a high degree of safety against uncontrolled continued burning of the plasma in the case of a short circuit.

The conductor track fuse according to the invention has the further advantage of a possible space-saving design of this fuse. The total area requirement on the printed circuit board is reduced by virtue of the fact that both sides of the printed circuit board are used for the fuse.

Should it be the case that very fine through contacts with little metal mass are used for the change of sides, then it can be advantageous if the through contacts are covered with SMD adhesive spots in order to be able to reliably prevent the plasma from burning away through the contact-connection. Since the underside and indeed also the top side of the printed circuit board in the case of modern electronic operating devices are usually populated in part with SMD components, a multiplicity of adhesive spots are applied before said components are mounted, which adhesive spots are intended to hold the components mounted thereon in position until the soldering process. Therefore, the extra costs of two additional adhesive spots on the through contacts are virtually zero.

In order, in the case of a short circuit, to prevent the plasma from crossing over to adjacent conductor tracks, it is advantageous if a partition is situated between the fusible link part of the conductor track and the adjacent conductor tracks. The partition can be fitted to the printed circuit board, but it can also be part of the housing. This has the advantage of simple assembly and low costs. On the side facing the fusible link, the partition can preferably be provided with an additional insulating deflection surface acting as a diffuser, in order that the plasma which arises during the melting of the fusible link and moves in the direction of the adjacent conductor track is deflected away from the latter, and in order to expand the plasma jet. It is thereby possible, in an effective and simple manner, to prevent the plasma from propagating and jumping over to adjacent conductor tracks, and thus to prevent an indirect short circuit.

For better reflection and deflection of the plasma, the deflection surface can be embodied in planar fashion and be placed obliquely with respect to the plane of the partition, the angle being chosen such that the plasma is directed away from the adjacent conductor track and, moreover, simple producibility is ensured.

For the placement of the oblique surface, it is possible to choose an angle of 45° with respect to the plane of the partition and the surface of the printed circuit board.

It is also possible to form a partition by means of suitable components, such as e.g. canned capacitors. For many cases this constitutes a solution which is practicable because it is sufficiently reliable and significantly more cost-effective.

BRIEF DESCRIPTION OF THE DRAWING(S)

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which the figures show:

FIG. 1 Plan view of the supply line part of the conductor track fuse according to the invention on the printed circuit board.

Figure 2:
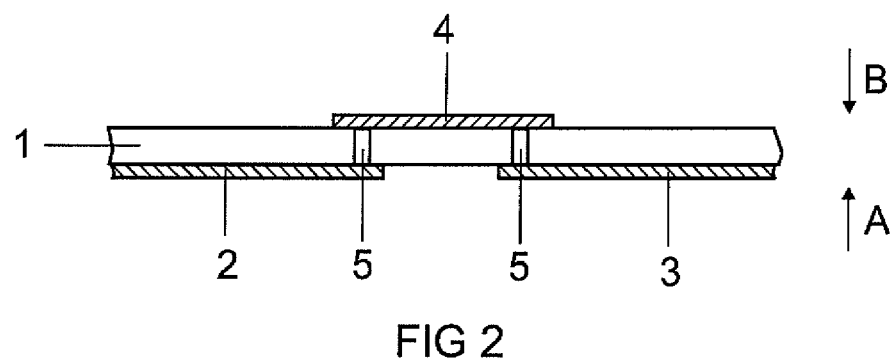

FIG. 2 Section through a conductor track fuse arrangement according to the invention.

Figure 3:
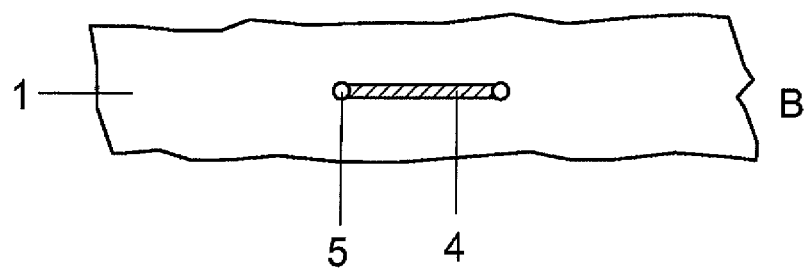

FIG. 3 Plan view of the fusible link part of the conductor track fuse according to the invention on the printed circuit board.

Figure 4A:
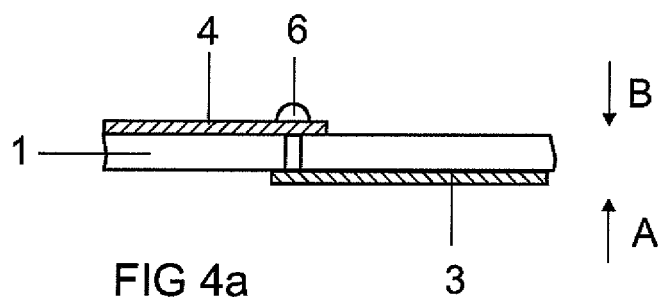

FIG. 4a Sectional view of a detail of the conductor track fuse with an SMD adhesive spot.

Figure 4B:
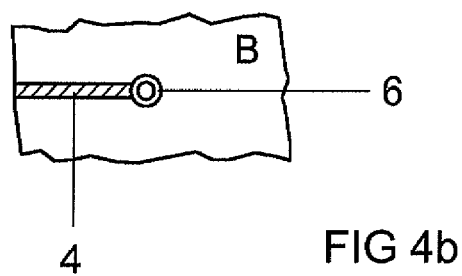

FIG. 4b Plan view of a detail of the conductor track fuse with an SMD adhesive spot.

Figure 5:
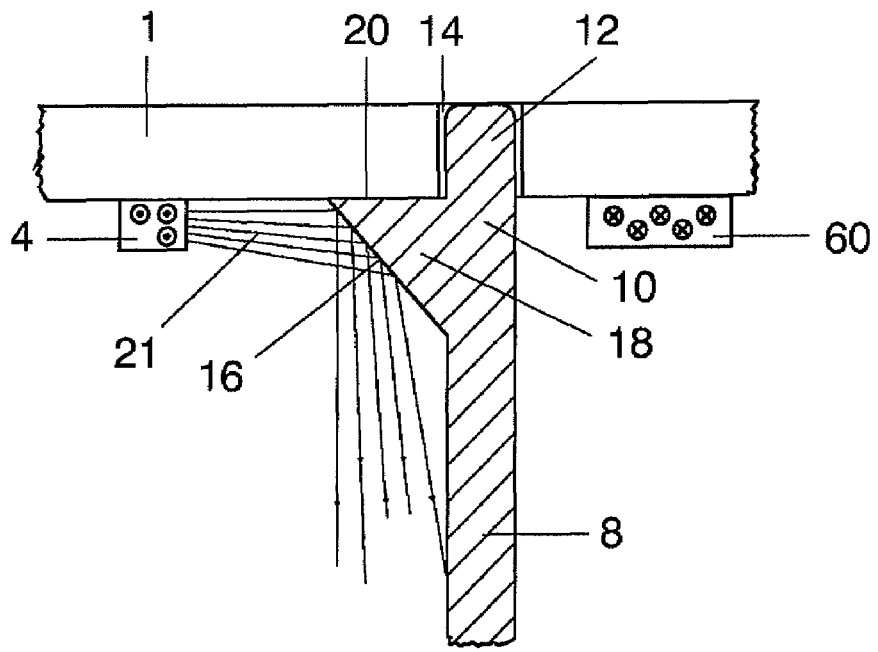

FIG. 5 Illustration of the conductor track fuse in interplay with a partition having an oblique deflection surface.

Figure 6:
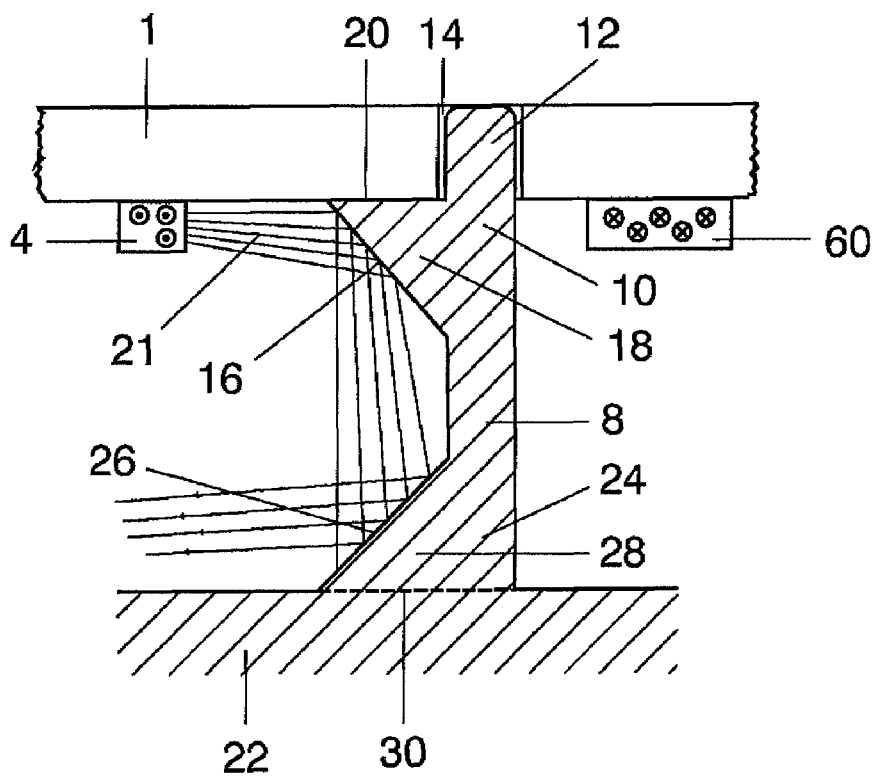

FIG. 6 Illustration of the conductor track fuse in interplay with a partition having two oblique deflection surfaces.

DETAILED DESCRIPTION

The following detailed description refers to the accompanying drawings that show, by way of illustration, specific details and embodiments in which the invention may be practiced.

As can be seen in FIGS. 1-3, the conductor track fuse is divided into two sections: the supply line part 2, 3 running on one side of the printed circuit board, and the fusible link part 4 running on the other side of the printed circuit board. The two parts are connected by means of two through contacts 5. The through contacts 5 can be pure vias, as illustrated in FIG. 2, but they can also be formed by a wired component, e.g. a resistor having a high resistance.

As shown in FIGS. 4a and 4b, the through contact 5 is preferably embodied as a pure via, and covered with an adhesive spot 6 composed of SMD adhesive on the side of the fusible link 4. Said adhesive spot can be applied in the course of SMD component mounting, with the result that an additional work operation is not necessary. The adhesive spot 6 additionally contributes to the fact that, in the case of a short circuit, the plasma 21 cannot burn through the through contact.

For the case where two conductor track fuses are respectively provided on different sides of the printed circuit board, the SMD adhesive spots can also be applied to the side of the supply line parts of the through contacts.

Consequently, only the narrow conductor track portion 4 lying between the through contacts 5 is evaporated, which ensures faultless and secure disconnection from the power supply.

In the case of devices with higher power, the short-circuit current may be so high that there is a certain risk of the conductive plasma 21 crossing over to other conductor tracks in the case of a short circuit (FIGS. 5 & 6). It is expedient in this case to provide a partition 8 between the fusible link 4 and adjacent conductor tracks 60, said partition preventing the plasma 21 from advancing into the regions of the adjacent conductor track portions 60. The partition 8 preferably has a deflection surface 16 facing the fusible link 4, said deflection surface being arranged at an oblique angle with respect to the surface of the printed circuit board. In the case of a short circuit, the plasma 21 flowing away from the fusible link 4 toward the deflection surface 16 and the adjacent conductor track portions 60 is directed away from the conductor track surface and dispersed, such that the conductivity of said plasma decreases. This deflection has the effect that plasma 21 can no longer pass into the vicinity of adjacent conductor track portions.

The deflection surface 16 can be arranged e.g. at an angle of 45° with respect to the surface of the printed circuit board. The partition 8 and the deflection surface 16 can form a component that is fixed to the printed circuit board, e.g. by being clipped into a cutout 14 in the printed circuit board. As illustrated in FIG. 6, the partition 8 can also have a second deflection surface 26, which deflects and disperses the plasma a further time, such that said plasma then flows away from the adjacent conductor tracks 60.

Preferably, however, the partition 8 and the deflection surface(s) 16, 26 are formed together with the housing 22. This has the advantage of lower costs since it is not necessary for an additional component to be produced and mounted. During the assembly of printed circuit board 1 and housing 22, the partition is then automatically situated at the correct location.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A double-sided printed circuit board, comprising: electrical conductor tracks fitted thereon and serving for electrically connecting components mounted on the printed circuit board, which has at least one conductor track fuse in the form of a conductor track with a fusible link part, wherein, upon the occurrence of an abnormal operating state, in particular an electrical short circuit, the electric circuit is interrupted by melting and evaporation of the fusible link part and plasma arises upon the evaporation of the fusible link part, wherein the fusible link part lies on the other side of the printed circuit board with respect to the supply line.

2. The printed circuit board as claimed in claim 1, wherein the fusible link part is situated between two through contacts.

3. The printed circuit board as claimed in claim 2, further comprising: a respective SMD adhesive spot situated on at least one of the fusible link side and the supply line side of the through contacts.

4. The printed circuit board as claimed in claim 1, wherein the fusible link part is situated on the underside of the printed circuit board.

5. The printed circuit board as claimed in claim 1, wherein an insulating partition is situated between the fusible link part and the adjacent conductor tracks.

6. The printed circuit board as claimed in claim 1, wherein the insulating partition comprises one suitable component or a plurality of suitable and suitably arranged components.

7. The printed circuit board as claimed in claim 5, wherein at least one deflection surface for deflecting and reflecting the plasma is formed on the side of the partition which faces the fusible link.

8. The printed circuit board as claimed in claim 6, wherein the deflection surface is arranged obliquely relative to the surface of the printed circuit board.

\* \* \* \* \*